US007388161B2

(12) United States Patent
Hsieh et al.

(10) Patent No.: US 7,388,161 B2
(45) Date of Patent: Jun. 17, 2008

(54) ELECTROMAGNETIC INTERFERENCE SHIELDING AND GROUNDING STRUCTURE AND THE APPLICATIONS THEREOF

(75) Inventors: Chang-Cheng Hsieh, Tao Yuan (TW); Kang Wu, Tao Yuan Shien (TW)

(73) Assignee: Quanta Computer Inc., Taoyuan Shien (TW)

( * ) Notice: Subject to any disclaimer, the term of this patent is extended or adjusted under 35 U.S.C. 154(b) by 172 days.

(21) Appl. No.: 11/374,200

(22) Filed: Mar. 14, 2006

(65) Prior Publication Data

US 2007/0042644 A1 Feb. 22, 2007

(30) Foreign Application Priority Data

Aug. 19, 2005 (TW) .............................. 94128488 A

(51) Int. Cl.
*H05K 9/00* (2006.01)

(52) U.S. Cl. ....................... 174/382; 361/818; 361/683

(58) Field of Classification Search ................ 174/377, 174/382; 361/816, 818, 683
See application file for complete search history.

(56) References Cited

U.S. PATENT DOCUMENTS 5,164,542 A * 11/1992 Hart ........................... 174/383
5,329,422 A * 7/1994 Sasaki ........................ 361/686
5,331,508 A * 7/1994 Hosoi et al. ................ 361/680
5,796,578 A * 8/1998 Jones ......................... 361/683
5,965,842 A * 10/1999 Ganninger et al. ......... 174/377

FOREIGN PATENT DOCUMENTS

TW 528280 4/2003

* cited by examiner

*Primary Examiner*—Hung V Ngo
(74) *Attorney, Agent, or Firm*—Rabin & Berdo, PC

(57) ABSTRACT

An electromagnetic interference (EMI) shielding and grounding structure of an electrical apparatus and the applications are provided, wherein the EMI shielding and grounding structure comprises a framework, a shell, and a conducting wire. The framework is electrically connected to the grounding of the apparatus. The conducting wire is wrapped with conductive cloth. The shell electrically connected with the framework is located between an electromagnetic source and the wire, wherein an electrical contact is formed between the shell and the conductive cloth.

18 Claims, 2 Drawing Sheets

ELECTROMAGNETIC INTERFERENCE SHIELDING AND GROUNDING STRUCTURE AND THE APPLICATIONS THEREOF

RELATED APPLICATIONS

The present application is based on, and claims priority from, Taiwan Application Serial Number 94128488, filed Aug. 19, 2005, the disclosure of which is hereby incorporated by reference herein in its entirety.

FIELD OF THE INVENTION

The present invention relates to an electromagnetic interference (EMI) shielding and grounding structure, and more particularly relates to an EMI shielding and grounding structure applied in an electronic apparatus for use to shield electromagnetic noise from interfering with the normal operation thereof.

BACKGROUND OF THE INVENTION

When an electronic apparatus, such as a notebook computer, portable TV, cell phone or PDA, is operated, parts of the electronic apparatus, such as a power source line, a conducting wire or an electronic component of the electronic apparatus, generate electromagnetic waves, and the signal noise due to the electromagnetic waves can interfere with the operation of other electronic components in the electronic apparatus. This mechanism is called electromagnetic interference (EMI).

With developments in electronic technology, signal transmitting speed has continuously increased to obtain better performance. For example, to enhance the performance of a liquid crystal display (LCD) the signal transmitting speed has to be accelerated. However, this causes serious EMI problems due to the electromagnetic noise being radiated from the signal wires of the LCD. In addition, the main design trend for electronic apparatuses has been in miniaturizing, worsening the EMI problems due to the decreasing distance between each of the electronic components located in the electronic apparatus. For example, a broadband noise generated by a switching power supply circuit can seriously interfere with the performance of the LCD when the switching power supply circuit is not distanced far enough away from the signal wires of the LCD.

To resolve the problems, a ferrite core has been provided that is put around the signal wires to eliminate their electromagnetic noise. Another method for resolving the problems is to wrap the signal wires in a conductive cloth for isolating the signal wires from other components, wherein a grounding pigtail electrically connected to the conductive cloth is also provided to reduce the EMI of the signal wires.

However, the use of the ferrite core in an electronic apparatus increases the weight of the electronic apparatus, restricts the space for electrical wiring, and requires more material cost. Furthermore, since securing the ferrite core in the apparatus is difficult, other components in the apparatus can be crushed by the unfixed ferrite core when the electronic apparatus is transported. Moreover, the use of the conductive cloth and the pigtail can merely eliminate the electromagnetic waves radiated from the signal wires but cannot also eliminate the electromagnetic waves radiated from the power supply line.

It is desirable to provide a cheaper EMI shielding and grounding structure for not only shielding an electronic component from EMI but also for eliminating the electromagnetic waves radiated from the component which is shielded.

SUMMARY OF THE INVENTION

Aspects of the present invention are providing a cheaper EMI shielding and grounding structure and its application methods for not only shielding a first electromagnetic source from external EMI but also reducing the EMI radiated from that which is shielded.

In a preferred embodiment of the present invention, the EMI shielding and grounding structure comprises a framework, a shell, and a conducting cloth. The framework is electrically connected with the grounding circuit of the electronic apparatus. The conductive cloth is used to wrap the first electromagnetic source. The shell electrically connected on the framework is located between the first electromagnetic source and a second electromagnetic source, wherein an electrical contact is formed between the shell and the conductive cloth.

In accordance with the preferred embodiment of the present invention, the first electromagnetic source is a conducting wire. The conducting wire can be shielded and grounded by the shell to avoid the EMI generated by other electromagnetic sources; at the same time, the electromagnetic waves radiated from the conducting wire can be eliminated via a radio frequency noise grounding contact interface formed by the framework, the shell, and the conductive cloth electrically connected to the grounding of the electronic apparatus. Since the embodiments of the present invention can shield an electronic component (electromagnetic source) from EMI and can simultaneously eliminate the electromagnetic waves radiated from that which is shielded and grounded to replace the more expensive conventional ferrite core, the EMI shielding and grounding structure of the present invention can reduce material cost.

Therefore, the preferred embodiment of the present invention can provide a cheaper EMI shielding and grounding structure and its application methods to shield an electromagnetic source from EMI and eliminate the electromagnetic waves radiated from that which is shielded and grounded simultaneously to accomplish the objectives of the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DETAILED DESCRIPTION OF THE PREFERRED EMBODIMENT

The objectives of the present invention are to provide an EMI shielding and grounding structure and the applying methods thereof that can reduce more material cost than that provided by the prior art. The EMI shielding and grounding structure is used for shielding a first electromagnetic source of an electronic apparatus from EMI and for simultaneously eliminating the electromagnetic waves radiated from that which is shielded.

The foregoing aspects and many of the attendant advantages of this invention will become more readily appreciated as the same becomes better understood by reference to the following detailed description, when taken in conjunction with the accompanying drawings, wherein the preferred embodiment of the present invention described as follows is an EMI shielding and grounding structure mounted in a laptop computer. In the embodiment, the first electromagnetic source of the electronic apparatus is a signal wire of an LCD display module of the laptop computer.

Figure 1:
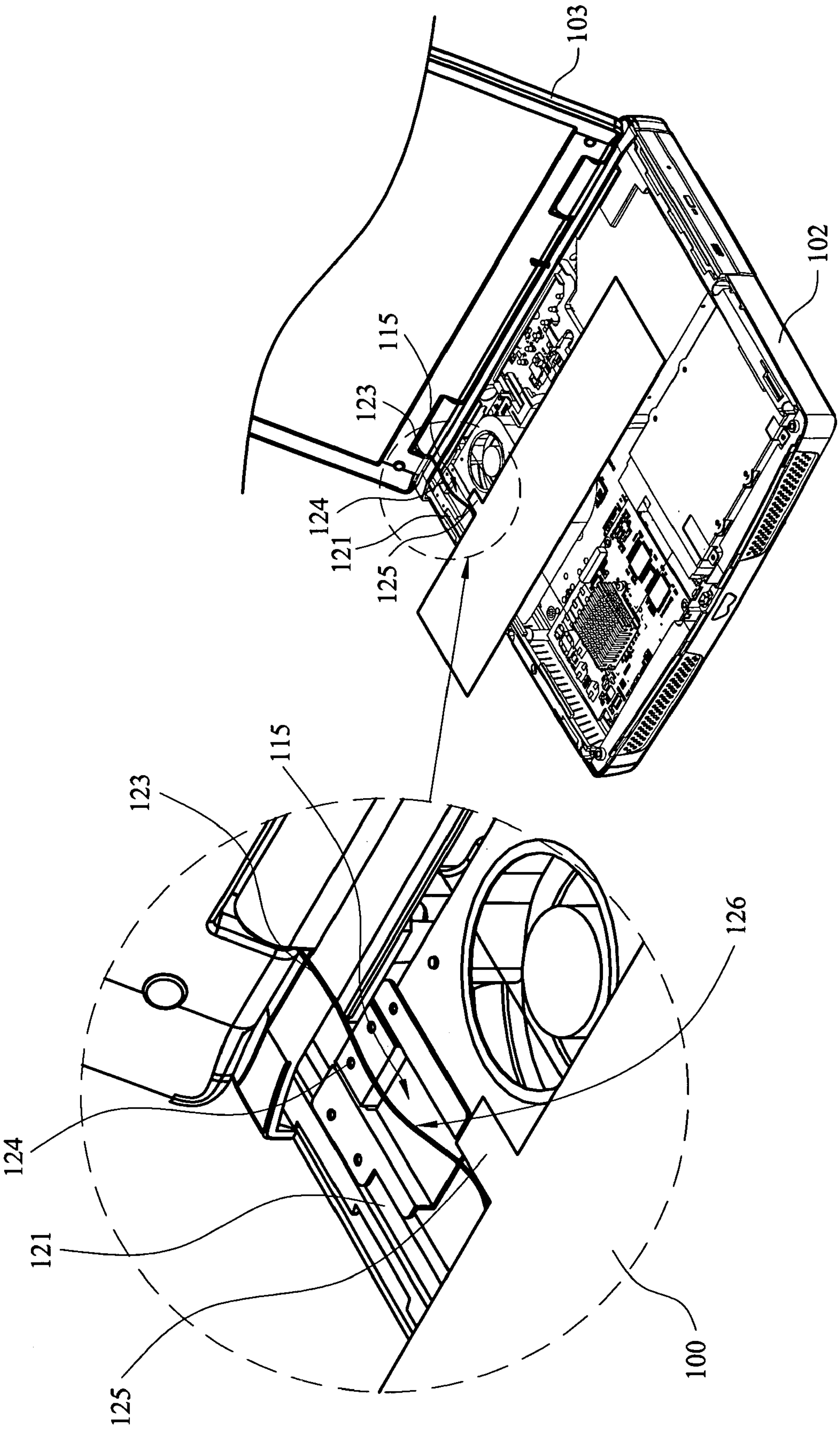
FIG. 1 illustrates the inner structure of a laptop computer, in accordance with one preferred embodiment of the present invention, wherein a portion of the structure is magnified.

FIG. 1 illustrates the inner structure of a laptop computer, in accordance with one preferred embodiment of the present invention, wherein a portion of the structure is magnified. In the preferred embodiment of the present invention, the EMI shielding and grounding structure 100 is mounted between the mainframe 102 of the laptop computer and the LCD display module 103, wherein the EMI shielding and grounding structure 100 is used to shield a signal wire 123 of the LCD display module 103 from the EMI generated by a second electromagnetic source of the laptop computer beneath the EMI shielding structure 100. In some embodiments of the present invention, the second electromagnetic source may be a power source, other signal wires, power supply lines or other electronic components of the laptop computer. In the present embodiment, the EMI shielding and grounding structure 100 is located between the signal wire 123 of the LCD display module 103 and a switching power supply circuit (not shown) of the laptop computer, and is used to shield the signal wire 123 from the broadband noise generated by the switching power supply circuit.

The EMI shielding and grounding structure 100 comprises a framework 121, a shell 122, and conductive cloth 126 wrapping around at least one conducting wire (such as wire 123). The framework 121 is a portion of the bottom case of the laptop computer, wherein the bottom case is electrically connected with the grounding circuit of the laptop computer. In the present embodiment of the present invention the framework 121 is formed of a rigid conductive material such as aluminum/magnesium alloy, tin, copper or an arbitrary combination thereof.

The conducting wire 123 set in the laptop computer is wrapped with the conductive cloth 126. In some embodiments of the present invention, the conducting wire 123 is a signal wire. In other embodiments of the present invention, the conducting wire 123 is a data line. In the present invention, the conducting wire 123 (hereafter referred to as signal wire 123) is a signal wire connecting the mainframe of the laptop computer with the LCD display module 103 for transmitting image signals.

The shell 122 located between the electromagnetic sources of the laptop computer and the signal wire 123 is fixed on the framework 121 by a plurality of fasteners 124, such as screws, and is electrically connected to the framework 121. In another embodiment of the present invention, the shell 122 is a flange of the framework 121 protruding therefrom.

Figure 2:
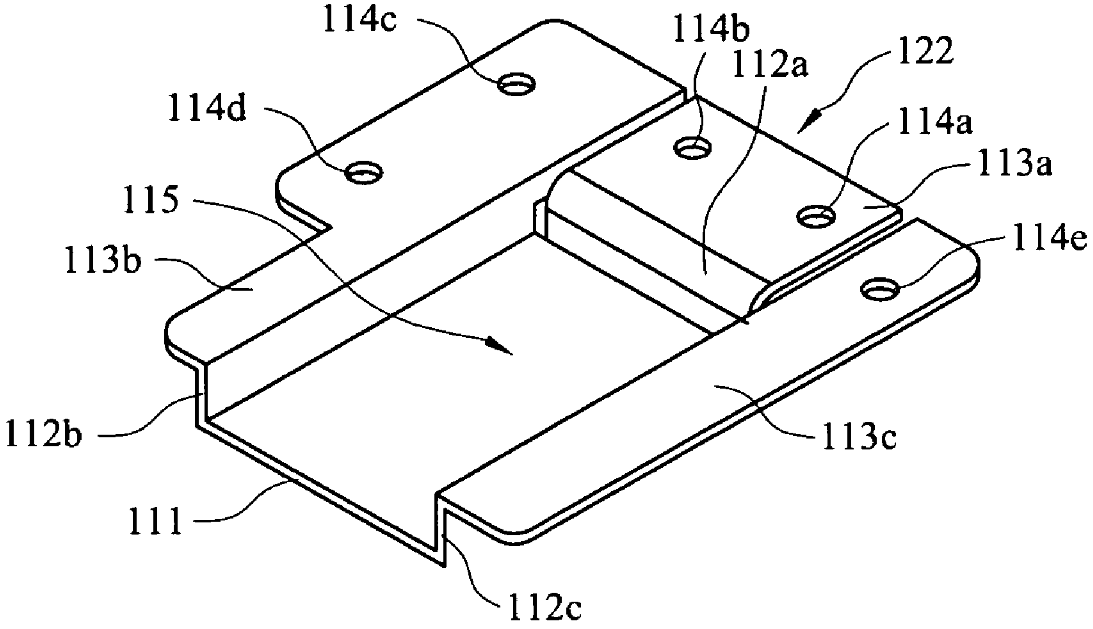
FIG. 2 illustrates the structure of the shell, in accordance with one preferred embodiment of the present invention.

FIG. 2 illustrates the structure of the shell 122, in accordance with one preferred embodiment of the present invention. The shell 122 has a recess 115 identified by a bottom 111 and three sidewalls 112*a*, 112*b* and 112*c* of the shell 122, by which an electrical contact between the signal wire 123 and the shell 122 can be formed more easily. The signal wire 123 extending from the mainframe 102 passes across the recess 115 from the end of the recess 115 where no sidewall is formed to one of the sidewalls (for example 112*a*, 112*b* or 112*c*) of the recess 115, and finally connects to the LCD display module 103. The broadband noise generated by the second electromagnetic source, for example a switching power supply circuit (not shown) beneath the bottom 111 can be shielded from interfering with the signal wire 123.

In the preferred embodiment of the invention, the EMI shielding and grounding structure 100 further comprises a depressor 125 set over the recess 115, wherein the signal wire 123 is clamped into the recess 115 of the shell 122 by the depressor 125. The depressor 125 is secured with the recess 115 by at least one fastener (not shown), such as a screw to exert a pressure greater than about 100 mg/cm$^2$ upon the signal wire 123. In the present invention, the depressor 125 is a flange protruding from the base shield of the cover case of the laptop computer that is used for isolating the EMI generated by the motherboard.

In the preferred embodiment of the present invention, each sidewall of the recess 115, for example 112*a* (112*b* or 112*c*) has a flange 113*a* (113*b* or 113*c*) protruding outward of the recess 115 respectively. Each of the flanges (such as 113*a*, 113*b* or 113*c*) has at least one hole. For example, the flange 113*a* has two holes 114*a* and 114*b;* the flange 113*b* also has two holes 114*c* and 114*d;* the flange 113*c* has only one hole 114*e*. These holes can be selected for screwing fasteners therein, either to secure the shell 122 with the framework 121 or securing the depressor 125 with the shell 122.

It should be noted that, the size and shape of the shell 122 and the bottom 111 thereof are not limited and are designed depending on the feature of the electromagnetic source.

In accordance with the described embodiments, the EMI shielding and grounding structure (formed by the shell 100) can protect the signal wire 123 located on one side of the shell 100 from interference by broadband noise generated by an electromagnetic source located on the other side of the shell 122. Besides, the EMI generated by the signal wire 123 can be grounded via a radio frequency noise grounding contact interface formed by the conductive cloth, the shell 122, the framework 121, and the grounding circuit of the laptop computer.

Therefore, the characteristic of the present invention is to provide an EMI shielding and grounding structure to replace a conventional ferrite core and a grounding pigtail. The advantages of the present invention are that the EMI shielding and grounding structure can eliminate at least two sources of EMI at the same time, so as to reduce the cost of material. For example, the EMI shielding and grounding structure can not only shield a signal wire from the EMI generated by a power supply line but also can eliminate the EMI generated by the signal wire.

As is understood by a person skilled in the art, the foregoing preferred embodiments of the present invention are illustrative, rather than limiting, of the present invention and are intended to cover various modifications and similar arrangements included within the spirit and scope of the appended claims, the scope of which should be accorded the broadest interpretation so as to encompass all such modifications and similar structures.

What is claimed is:

1. An electromagnetic interference (EMI) shielding and grounding structure used for shielding a first electromagnetic source of an electronic apparatus from the EMI generated by a second electromagnetic source and for reducing the EMI generated by the shielded first electromagnetic source, comprising:

a framework, electrically connected to a grounding circuit of the electronic apparatus;

a conductive cloth wrapping the first electromagnetic source;

a shell, electrically connected with the framework, the shell being located between the first electromagnetic source and the second electromagnetic source, the shell having a recess, the first electromagnetic source passing across the recess and extending over at least one sidewall of the recess; and a depressor set over the recess to clamp the first electromagnetic source into the recess, so as to exert a pressure greater than about 100 mg/cm$^2$ upon the first electromagnetic source, whereby an electrical contact is formed between the shell and the conductive cloth.

2. The electromagnetic EMI shielding and grounding structure in accordance with claim 1, wherein the first electromagnetic source is a conducting wire.

3. The electromagnetic EMI shielding and grounding structure in accordance with claim 1, wherein the second electromagnetic source is selected from a group consisting of a power source, a signal wire, a power supply line, an electronic component of the apparatus and an arbitrary combination thereof.

4. The electromagnetic EMI shielding and grounding structure in accordance with claim 1, wherein the framework is a portion of a bottom case of the electronic apparatus.

5. The electromagnetic EMI shielding and grounding structure in accordance with claim 1, wherein the framework is made of a conductive material.

6. The electromagnetic EMI shielding and grounding structure in accordance with claim 5, wherein the conductive material is selected from a group consisting of aluminum/magnesium alloy, tin, copper and an arbitrary combination thereof.

7. The electromagnetic EMI shielding and grounding structure in accordance with claim 1, wherein the shell is made of a conductive material.

8. The electromagnetic EMI shielding and grounding structure in accordance with claim 7, wherein the conductive material is selected from a group consisting of aluminum/magnesium alloy, tin, copper and an arbitrary combination thereof.

9. The electromagnetic EMI shielding and grounding structure in accordance with claim 1, wherein the shell is secured with the framework by a fastener.

10. The electromagnetic EMI shielding and grounding structure in accordance with claim 1, wherein the shell is a protruding flange of the framework.

11. A method for shielding a conducting wire of an electronic apparatus from EMI generated by an electromagnetic source and for reducing the EMI generated by the conducting wire, comprising:

wrapping the conducting wire with a conductive cloth;

providing a shell mounted on a framework that is electrically connected to the grounding circuit of the apparatus, the shell being located between the electromagnetic source and the conducting wire, the shell having a recess, the first conducting wire passing across the recess and extending over at least one sidewall of the recess; and providing a depressor to clamp the conducting wire into the recess, so as to exert a pressure greater than about 100 mg/cm$^2$ upon the conducting wire, to form an electrical contact between the conductive cloth and the shell.

12. The method in accordance with claim 11, wherein the framework is made of a conductive material.

13. The method in accordance with claim 12, wherein the conductive material is selected from a group consisting of aluminum/magnesium alloy, tin, copper and an arbitrary combination thereof.

14. The method in accordance with claim 11, wherein the shell is made of a conductive material.

15. The method in accordance with claim 14, wherein the conductive material is selected from a group consisting of aluminum/magnesium alloy, tin, copper and an arbitrary combination thereof.

16. The method in accordance with claim 11, wherein the shell is secured with the framework by a fastener.

17. The method in accordance with claim 11, wherein the shell is a protruding flange of the framework.

18. The method in accordance with claim 11, wherein the electromagnetic source is selected from a group consisting of a power source, a signal wire, a power supply line, an electronic component of the apparatus and an arbitrary combination thereof.

* * * * *